US008502367B2

(12) United States Patent  (10) Patent No.: US 8,502,367 B2
Luan                            (45) Date of Patent:   Aug. 6, 2013

(54) WAFER-LEVEL PACKAGING METHOD USING COMPOSITE MATERIAL AS A BASE

(75) Inventor: Jing-En Luan, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 255 days.

(21) Appl. No.: 12/893,651

(22) Filed: Sep. 29, 2010

(65) Prior Publication Data

US 2012/0074592 A1    Mar. 29, 2012

(51) Int. Cl.
*H01L 23/495*       (2006.01)
(52) U.S. Cl.
USPC ............... 257/686; 257/723; 257/E23.177; 257/E23.065
(58) Field of Classification Search
USPC ........... 257/685, 686, 723, E23.065, E23.177
See application file for complete search history.

(56) References Cited

U.S. PATENT DOCUMENTS

| 4,612,601 | A | 9/1986 | Watari |
| 5,288,944 | A | 2/1994 | Bronson et al. |
| 6,087,202 | A | 7/2000 | Exposito et al. |
| 6,270,019 | B1 | 8/2001 | Reighard |
| 6,423,570 | B1 | 7/2002 | Ma et al. |
| 6,706,553 | B2 | 3/2004 | Towle et al. |
| 6,902,950 | B2 | 6/2005 | Ma et al. |
| 6,930,378 | B1 | 8/2005 | St. Amand et al. |
| 7,459,781 | B2 | 12/2008 | Yang et al. |
| 7,888,172 | B2 | 2/2011 | Huang |
| 7,947,530 | B2 | 5/2011 | Kim et al. |
| 8,106,504 | B2 | 1/2012 | Yang |
| 2004/0046254 | A1 | 3/2004 | Lin et al. |
| 2005/0148160 | A1 | 7/2005 | Farnworth et al. |
| 2006/0035415 | A1 | 2/2006 | Wood et al. |
| 2007/0224733 | A1 | 9/2007 | Boyle et al. |
| 2007/0231469 | A1* | 10/2007 | Lin et al. ............... 427/96.1 |
| 2010/0167471 | A1 | 7/2010 | Jin et al. |
| 2010/0244208 | A1* | 9/2010 | Pagaila et al. ............ 257/659 |
| 2011/0156239 | A1 | 6/2011 | Jin |
| 2011/0278741 | A1* | 11/2011 | Chua et al. .............. 257/777 |
| 2012/0244664 | A1 | 9/2012 | Jin et al. |

OTHER PUBLICATIONS

"COB IC's", retrieved from http://www.engineersgarage.com/articles/cob-ics, retrieved on Dec. 17, 2012, 12 pages.
"Definition of: chip on board", retrieved from http://www.pcmag.com/encyclopedia_term/0,1237,t=chip+on+board&i=39643,00,asp, retrieved on Dec. 17, 2012, 1 page.
"Electronics Packaging Technology Update: BGA, CSP, DCA and Flip Chip", retrieved from http://www.emeraldinsight.com/journals.htm?articleid=1455546&show=html, retrieved on Dec. 17, 2012, 1 page.

* cited by examiner

*Primary Examiner* — Matthew W Such
*Assistant Examiner* — Krista Soderholm
(74) *Attorney, Agent, or Firm* — Seed IP Law Group PLLC

(57) ABSTRACT

An electronic package that includes a composite material base. In one embodiment the electronic package is an expanded wafer-level package. The composite material base is composed of woven strands and polymer material. In one embodiment the composite material base is composed of woven fiberglass strands and an epoxy material. In various embodiments the package includes an electronic circuitry layer on one or another face of the composite material base. In other embodiments conductive vias connect the circuitry layers, including a redistribution layer. In yet another embodiment an electronic package is mounted on the composite material base and electrically couples to the circuit of the expanded wafer-level package. The package having the composite material base is mechanically stronger and can be made thinner than a package that relies on an encapsulant material for structure, and resists cracking.

18 Claims, 12 Drawing Sheets

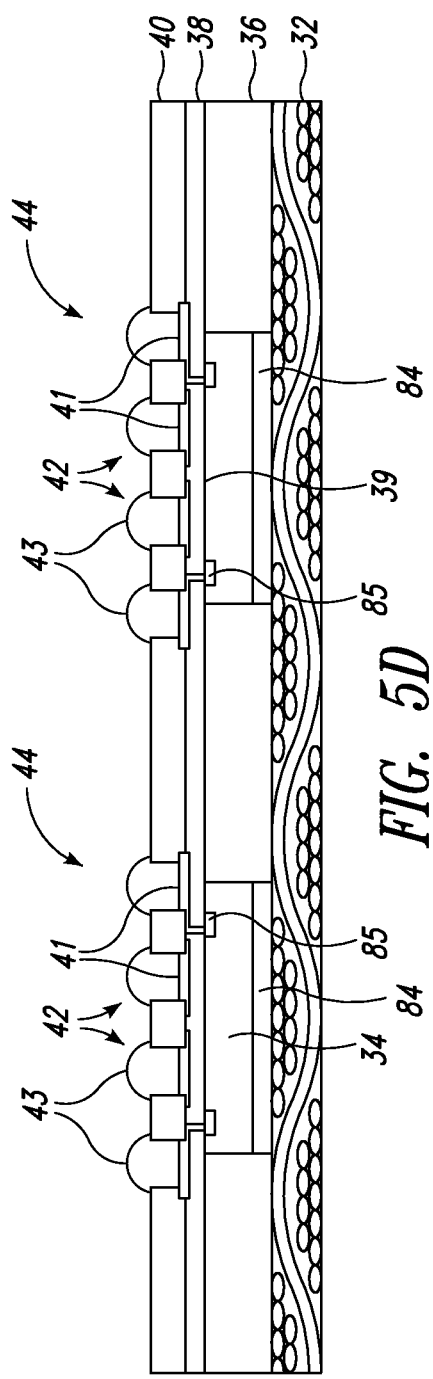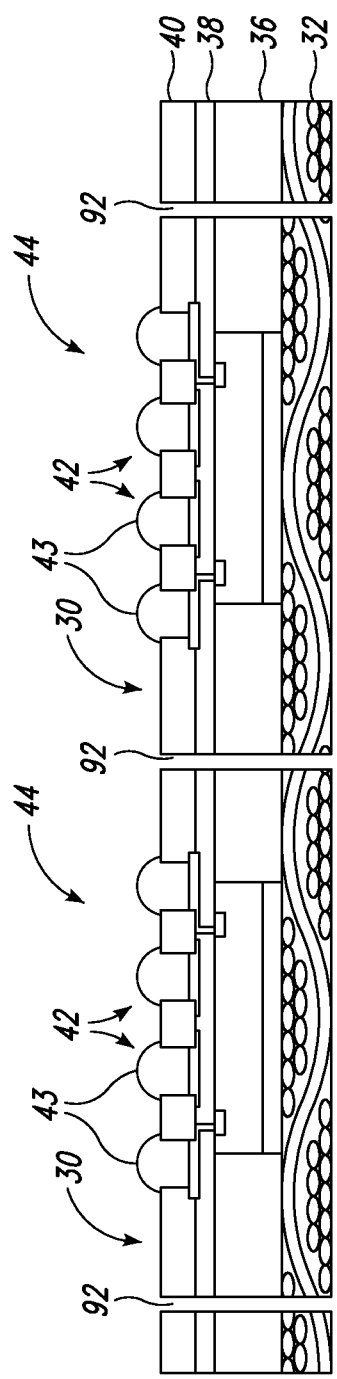

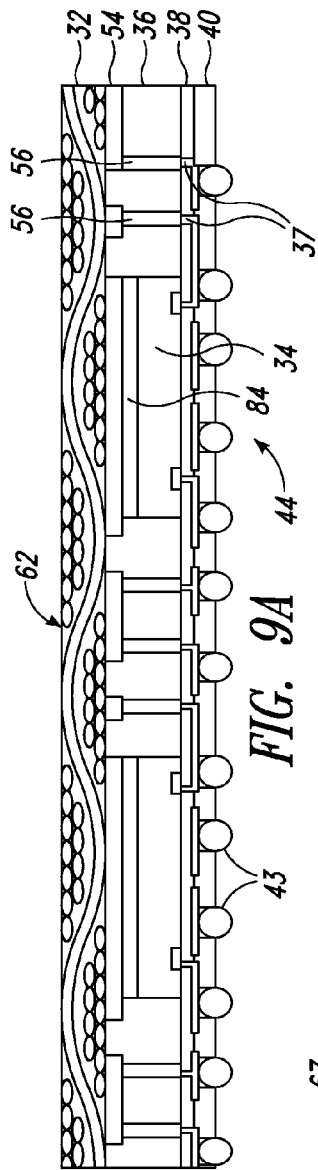
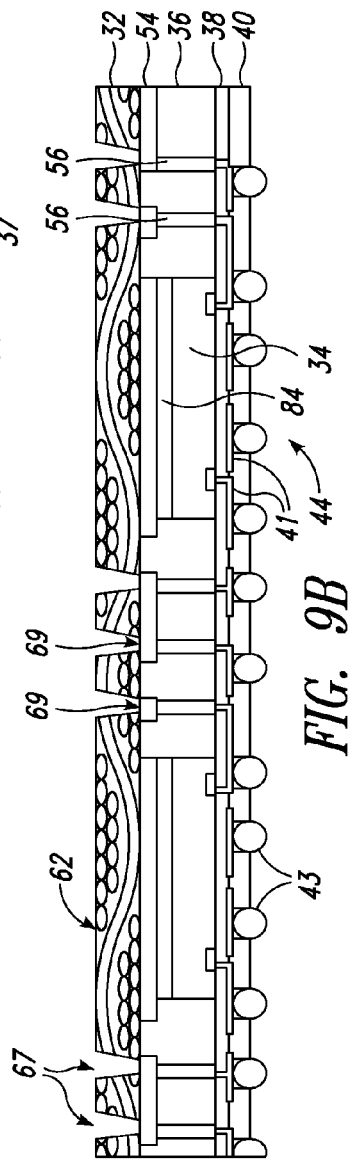
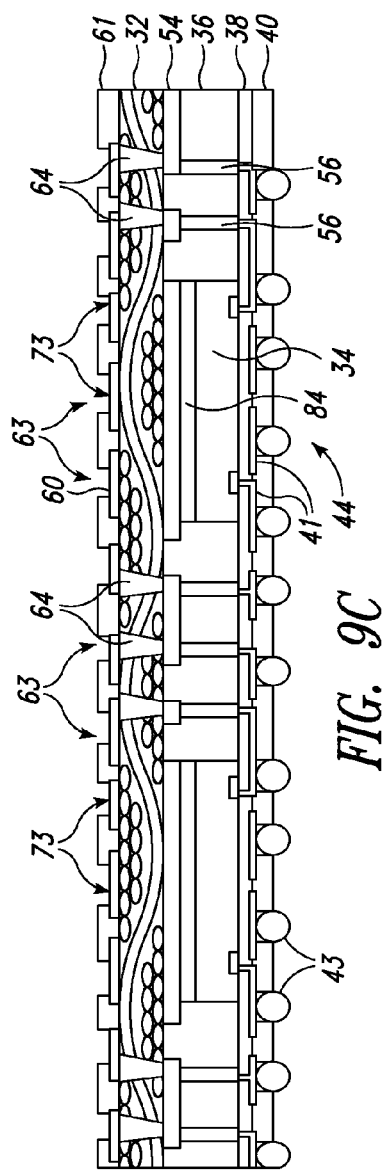

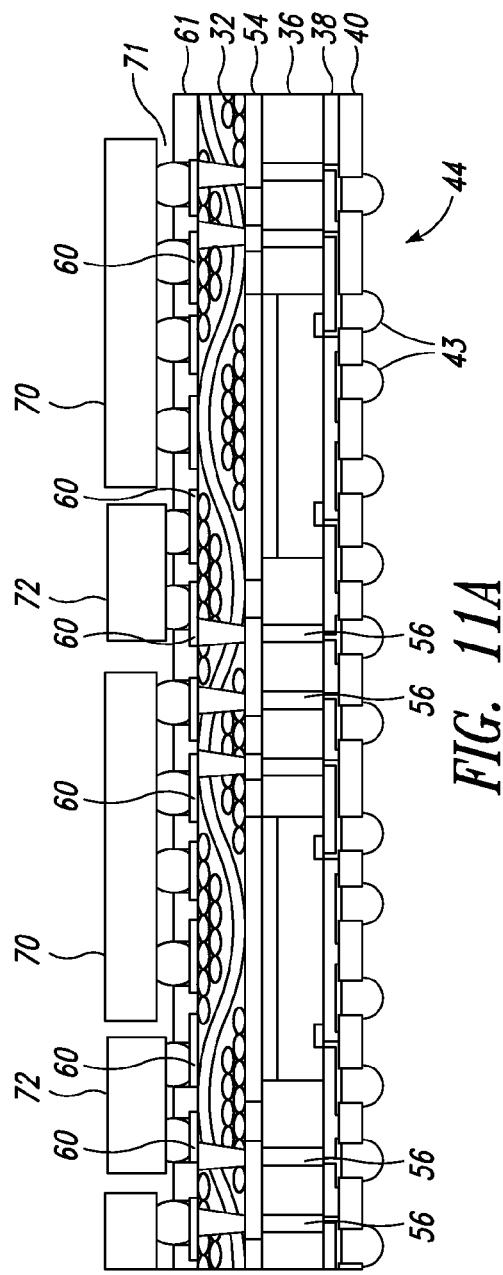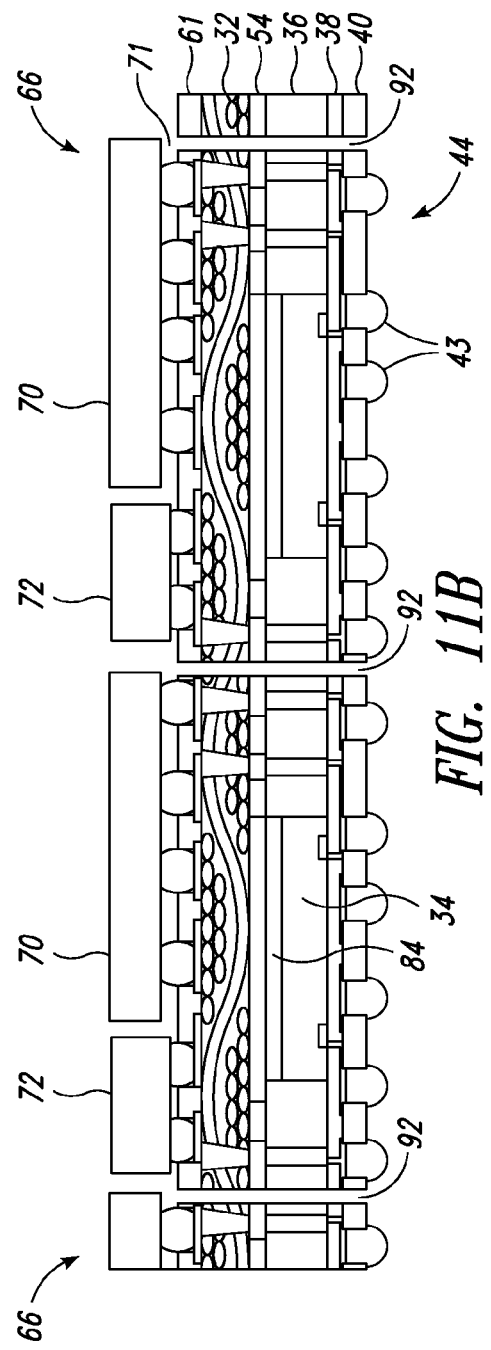

WAFER-LEVEL PACKAGING METHOD USING COMPOSITE MATERIAL AS A BASE

BACKGROUND

1. Technical Field

This description generally relates to the field of electronic devices and, in particular, to packaged semiconductor electronic devices.

2. Description of the Related Art

Semiconductor die are packaged to protect the die from operating environments and to provide an electrical interface between a die and an electronic device in which the die is utilized. Traditionally, die packaging techniques were distinct from semiconductor manufacturing techniques used in wafer level processing. Recently, some wafer level processing techniques have begun to be used in constructing the die packages.

FIG. 1 is a cross-sectional view of a known package 10 that includes a semiconductor die 12 between an encapsulation layer 14 and a redistribution layer 16. A passivation layer 18 has a plurality of openings 17 configured to receive a plurality of solder balls 19 of a ball grid array 20. The encapsulation layer 14 covers a top surface 13 and side surfaces 15 of the semiconductor die 12. A bottom surface 22 of a die 34 is on a redistribution layer 16. The redistribution layer 16 includes a plurality of electrically conductive traces 21 aligned with the openings 17 through the passivation layer 18. The solder balls 19 of the ball grid array 20 electrically connect to the conductive traces 21.

Semiconductor die packaged according to the wafer-level packaging techniques of the prior art such as in FIG. 1 have several limitations. One limitation is that for wafer-level packages where the die and the encapsulation layer are thin, the package is susceptible to cracking. A second limitation is that during manufacturing of a wafer-level package a carrier is needed to support the package. This is to provide support to the package during its construction. Providing a carrier during manufacturing also introduces the disadvantages of adding steps to attach and remove the carrier, which adds cost and time to the manufacturing process. A further disadvantage is that complete removal of a carrier adhesive can be difficult or impossible.

BRIEF SUMMARY

According to a first embodiment of the present disclosure, an electronic package includes a semiconductor die, an encapsulation layer, a first layer of conductive traces, an electrical interconnect, and a composite material base. The encapsulation layer surrounds at least a portion of the semiconductor die and has top and bottom faces. In the first embodiment, the bottom face of the encapsulation layer is coplanar to a bottom face of the semiconductor die. A composite material base and a top face of the encapsulation layer adhere to one another.

The composite material strengthens the electronic package, prevents cracking of the other layers of the package, serves as a carrier during package manufacturing, and allows the package to be thinner than it would be if the encapsulation layer had to provide all the support for the electronic package.

In another embodiment, the electronic package includes a buried electrically conductive layer and a first plurality of electrically conductive vias. The buried electrically conductive layer lies between the encapsulation layer and the composite material base. The first plurality of electrically conductive vias extends through the encapsulation layer and electrically connects the first layer of conductive traces with the buried electrically conductive layer. In one embodiment the buried electrically conductive layer is an electrical circuit, in another embodiment the layer is a ground plane, and in yet another embodiment the layer is an electromagnetic interference shield.

In another embodiment, a second layer of conductive traces and a second plurality of electrically conductive vias are formed on the package. The second layer of conductive traces lies on a top face of the composite material base. The second plurality of electrically conductive vias extends through the composite material base and electrically connects the second layer of conductive traces with the buried electrically conductive layer. The electrically connected first and second layers of conductive traces and buried electrically conductive layer form a multilayer electrical circuit connected to the integrated circuit of the semiconductor die, enabling a more compact electronic package.

According to another embodiment of the disclosure, the composite material base is made of woven strands embedded in a polymer material. In a further embodiment, the woven strands are fiberglass and the polymer material is an epoxy. In a further embodiment, the woven strands are laminated between sheets of epoxy, the sheets of epoxy bonding with one another through spaces in the woven strands.

According to an embodiment of a method of making the electronic package, an electronic circuit is fabricated on a die, the die is adhered to a composite material base, the die is encapsulated in an encapsulation layer, a layer of conductive traces is deposited on a face of the die and encapsulation layer, an electrical interconnect is placed on the layer of conductive traces, and the package is singulated from an array.

According to another embodiment of a method of making the electronic package, an electronic circuit is fabricated on a die, a buried electrically conductive layer is deposited on a composite material base, the die is adhered to the composite material base, the die is encapsulated in an encapsulation layer, vias are placed through the encapsulation layer, the vias are filled with electrically conductive material, a layer of conductive traces is deposited on a face of the die and encapsulation layer, an electrical interconnect is placed on the layer of conductive traces, and the package is singulated from an array.

According to a further embodiment of the previous method, via holes are placed through the composite material base, the vias are filled with electrically conductive material, and a layer of conductive traces is placed on the top of the composite material base.

According to still a further embodiment of the previous method, a complementary electronic package is placed on the layer of conductive traces on top of the composite material base.

Advantages of the disclosure are that the package can be made thin and yet strong. The package is also resistant to brittle fracture and outperforms equivalent packages in drop tests and mechanical load tests. Circuits packaged according to the method are better able to withstand drops, as occurs with portable electronic devices. The method integrates well with existing manufacturing processes used in wafer-level packaging. The method also enables circuit package manufacturing without a removable carrier because the base provides a carrier during manufacturing and stays with the assembled package for the duration of the package's life.

BRIEF DESCRIPTION OF THE SEVERAL VIEWS OF THE DRAWINGS

FIGS. 5A-5E are cross-sectional views of a method of forming a package having a composite material base in accordance with an embodiment of the present disclosure.

FIGS. 9A-9C are steps in a method of forming the package of FIGS. 8A and 8B having the composite material base.

FIGS. 11A and 11B are cross-sectional views of steps of a method of forming the stacked packages of FIGS. 10A and 10B.

DETAILED DESCRIPTION

Figure 1:
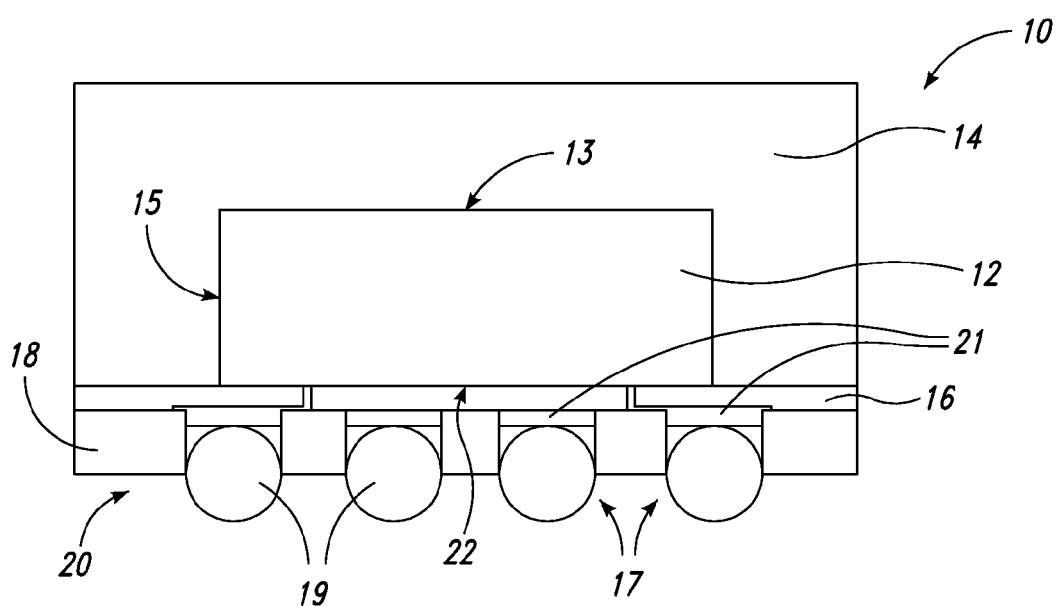
FIG. 1 shows a cut-away view of a known package.
Figure 2A:
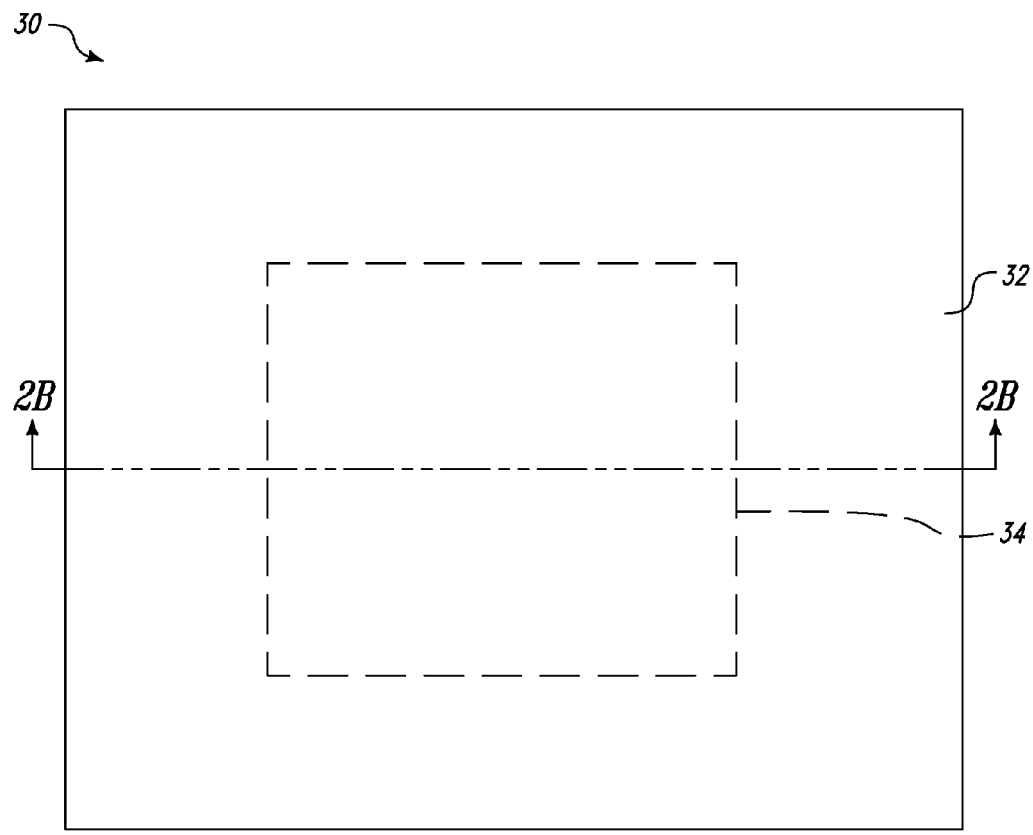
FIGS. 2A and 2B respectively show a top view and a cross-sectional view of a first embodiment of a package having a composite material base.
Figure 2B:
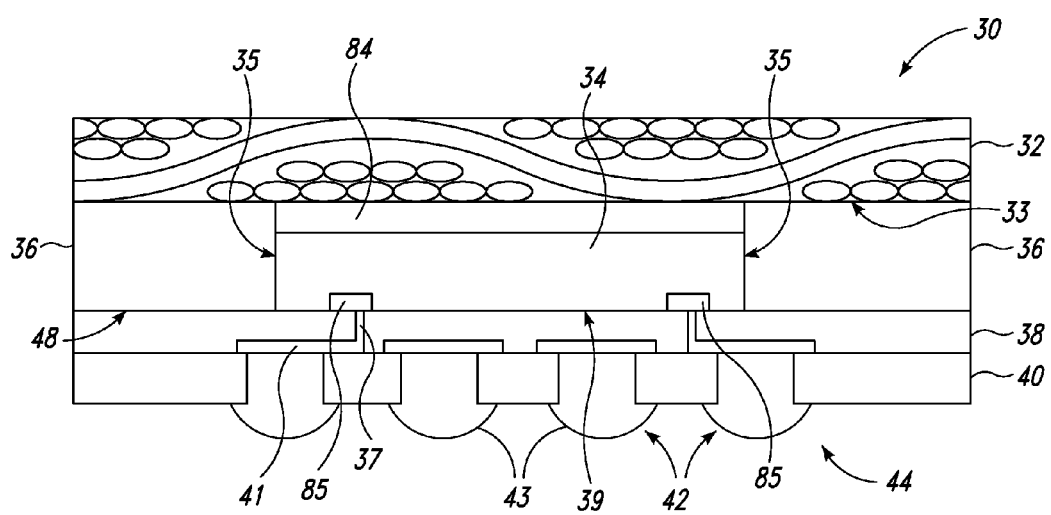

In FIGS. 2A and 2B, a first package 30 having a composite material base 32 is shown in accordance with one embodiment of the present disclosure. FIG. 2A is a top down view of the first package 30 having the composite material base 32 on a semiconductor die 34. FIG. 2B is a cross-sectional view of the first package 30 taken through 2B-2B.

The first package 30 has the semiconductor die 34 positioned on a first surface 33 of the composite material base 32. The semiconductor die includes an electronic circuit (not shown) for performing a desired function. In one embodiment the composite material base 32 is in the range of 20 µm and 400 µm in thickness. In some devices, such as mobile devices, the composite material base 32 may be in a more narrow range of thickness between 50 µm and 150 µm, depending on the size constraints of the mobile device.

In one embodiment of the first package 30, the composite material base 32 is 200 mm by 200 mm square as shown in FIG. 2A. In another embodiment of the package 30, the composite material base 32 is 300 mm by 400 mm. During the packaging process, a 12 inch by 12 inch square of the composite material base 32 may be used for an array of die 34 before singulation.

An adhesive layer 84, such as a double-sided adhesive tape, attaches the die 34 to the composite material base 32. The die 34 includes a first surface 39 and a set of electrical contacts 85, positioned on the bottom surface, which are connected to the electronic circuit of the die. A dielectric encapsulation layer 36 laterally surrounds the die and contacts sidewalls 35 of the die 34. A dielectric redistribution layer 38 is on the first surface 39 of the die 34. The first surface 39 of the die 34 is substantially coplanar with a first surface 48 of the encapsulation layer 36. A passivation layer 40 is on a bottom surface of the redistribution layer 38 such that the redistribution layer is between the die 34 and the passivation layer 40.

A plurality of conductive first contacts 41 are positioned between the bottom surface of the redistribution layer 38 and the passivation layer 40. A plurality of first interconnections 37 extend completely through the redistribution layer 38 and electrically couple the contacts 85 of the die 34 to the first contacts 41. A plurality of openings 42 extend through the passivation layer 40 in positions immediately adjacent to the first contacts 41. A plurality of solder balls 43 of a ball grid array 44 extend into the openings 42 and directly contact the first contacts 41. The solder balls 43 provide an electrical interface between the die 34, via the die contacts 85, first interconnections 37, and first contacts 41, and external circuits of the device to which the first package 30 is to be connected.

Figure 3:
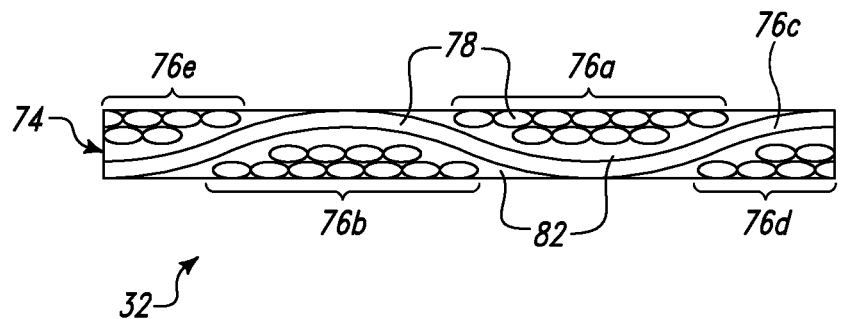
FIG. 3 is a cross-sectional view of a composite material base used in the package of FIGS. 2A and 2B.

FIG. 3 is a cross-sectional view of the composite material base 32 which has a plurality of fiber bundles 76 that are woven together. Some of the bundles 76, such as bundle 76a and bundle 76b are adjacent to each other and extend in and out of FIG. 3. Other bundles, such as bundle 76c, are transverse to bundles 76a and 76b and extend left to right in FIG. 3. Each bundle alternates over and under adjacent transverse bundles. For example, bundle 76c is over bundle 76d, under bundle 76a, over bundle 76b, and under bundle 76e.

Each bundle 76 includes a plurality of fibers 78 or strands of flexible resilient material. In one embodiment, the fibers are elongated fiberglass strands. FIG. 3 shows eleven fibers 78 per bundle, however the number of fibers 78 is illustrative and any number of fibers 78 may be utilized to achieve the composite material having the desired qualities.

The bundles 76 are encased in a support material 82 that makes the composite material base 32 rigid enough to support the plurality of die 34 during the packaging process. The support material 82 may be a polymer or other material sufficient to bind the fibers 78 of the bundles 76 in the woven pattern. The support material 82 may be applied to the fiber bundles 76 in a liquid form so that the support material 82 fills in spaces between the woven bundles. Alternatively, the woven bundles 76 of fibers 78 are placed between two polymer sheets and heated to form the support material. In one embodiment, the heat causes the polymer sheets to flow between the fibers 78 and bond to each other to form the support material 82. In another embodiment, the polymer sheets form a laminate of the support material over the bundles of fibers. Once solidified, the support material 82 is not brittle, which minimizes the risk of cracking during the packaging.

Figure 4:
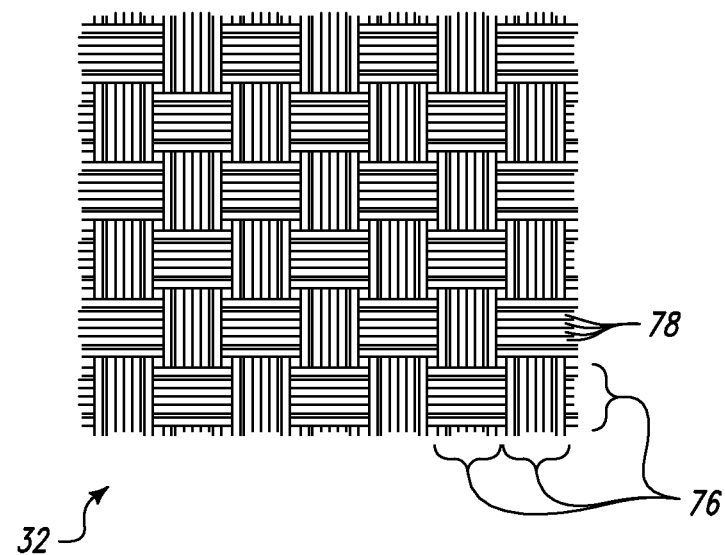
FIG. 4 is a top down view of the composite material base of FIG. 3.

FIG. 4 is a top down view of the composite material base 32 having the plurality of fibers 78 arranged in the plurality of bundles 76. The over and under woven pattern forms a strong yet flexible material for supporting the plurality of die 34. The composite material base 32 has moderate flexibility under deflection without risk of catastrophic failure due to a tensile strength of the woven bundles 76 of fibers 78.

In one embodiment, the fibers 78 are flame resistant woven fiberglass cloth and the support material is a flame resistant epoxy resin binder, such as an FR-4 grade reinforced glass epoxy laminate sheet having the woven bundles of fibers. FR-4 grade is a high-pressure thermoset plastic laminate with good mechanical strength-to-weight ratios that maintains its mechanical qualities in dry and humid conditions. Fiberglass has high tensile strength with flexibility.

Figure 5A:
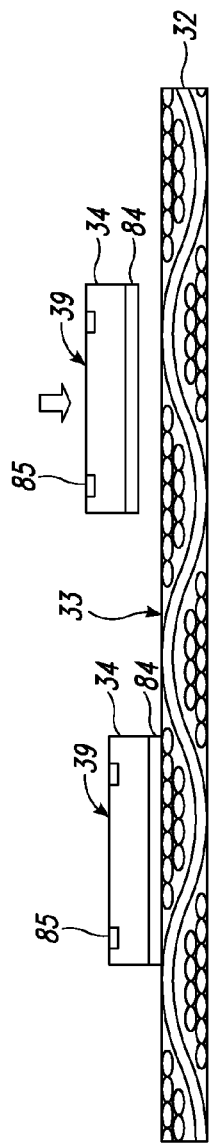

FIGS. 5A-5E show steps in a method of making the first package 30 on the composite material base 32 in accordance with one embodiment of the present disclosure. In FIG. 5A, the plurality of dies 34 are placed on the first surface 33 of the composite material base 32 using the adhesive layers 84. In one embodiment, each adhesive layer 84 is first attached to the corresponding semiconductor die 34 and then the die 34 and the adhesive layer 84 are attached as a unit to the composite material base 32. In another embodiment the adhesive layers 84 are attached to the composite material base 32 and the semiconductor dies 34 are positioned on the respective adhesive layers 84. The dies 34 may be placed on the composite material base 32 manually or by an automated process.

Figure 5B:
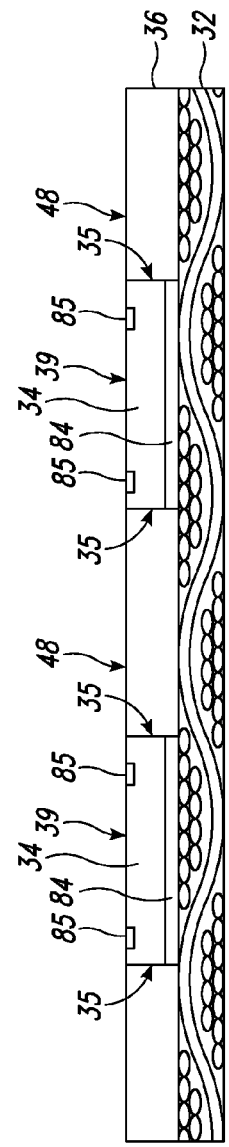

In FIG. 5B, the encapsulation layer 36 is formed adjacent to the sides 35 of the die 34. In one embodiment the encapsulation layer 36 is a curable photosensitive material that is deposited on the first surface 33 of the composite base material 32. The encapsulation layer 36 has the first surface 48 that is substantially coplanar with the first surface 39 of the die 34. In one embodiment, the first surface 48 of the encapsulation layer 36 is planarized to be coplanar with the first surface 39 of the die 34.

Figure 5C:
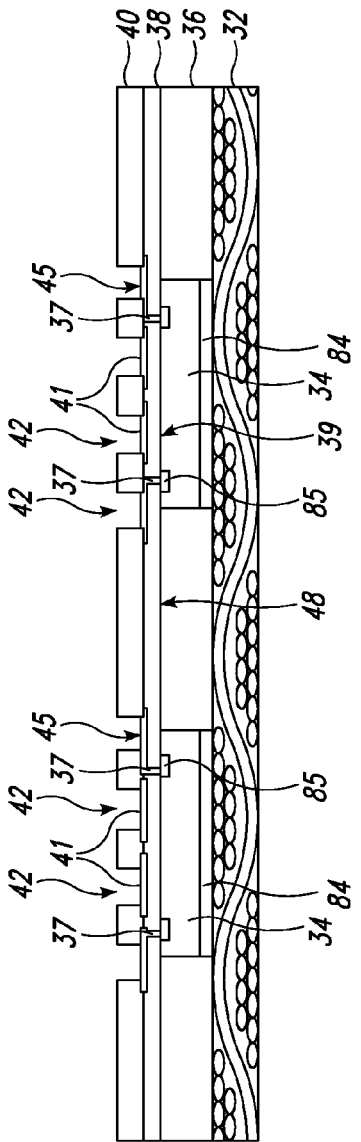

In FIG. 5C, the redistribution layer 38 is formed on the first surface 39 of the die 34 and the first surface 48 of the encapsulation layer 36. The redistribution layer 38 is an insulating layer through which a plurality of vias are formed and filled with conductive material to form the first interconnections 37. Subsequently, a metal layer is formed over the redistribution layer 38 and etched to form the plurality of first contacts 41. In an alternative embodiment, the redistribution layer 38 is etched to form recesses in which a conductive material is formed to form the first contacts 41.

The passivation layer 40 is formed on the first contacts 41 and the redistribution layer 38. The plurality of openings 42 are formed through the passivation layer 40 to expose a surface 45 of the first contacts 41. In one embodiment, the passivation layer 40 may be a plurality of passivation layers or insulating layers. In another embodiment, the redistribution layer 38 may be a plurality of layers.

FIG. 5D includes the plurality of solder balls 43 of the ball grid arrays 44 formed in the openings 42 through the passivation layer 40. Each solder ball 43 electrically connects to one of the plurality of first contacts 41, which couples the solder balls 43 to the die 34.

In FIG. 5E, the overall structure formed on the base material 32 is singulated into the plurality of packages 30. Singulation may be achieved by placing a cut 92 through the layers of the overall structure with a saw, a water jet tool, laser tool, or other methods of separating the individual packages 30.

Figure 6A:
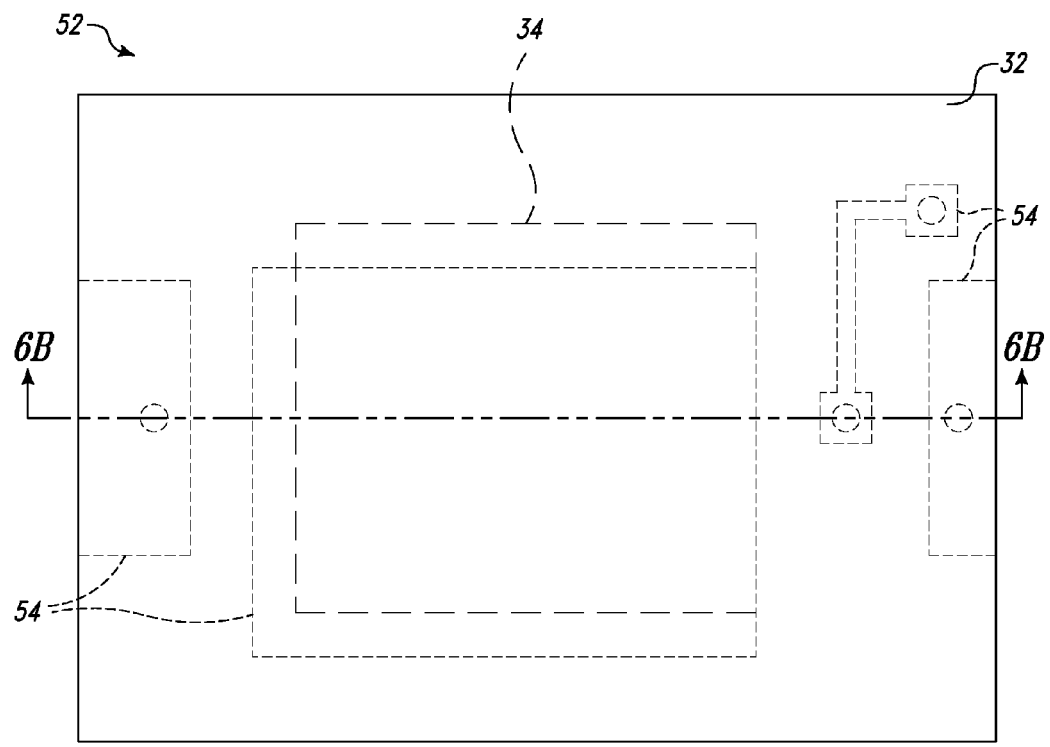
FIGS. 6A and 6B show top and cross-sectional views of a package having a composite material base in accordance with one embodiment of the present disclosure.

FIG. 6A is a top down view of a second package 52 having the composite material base 32. The second package 52 is similar to the first package 30, but includes a buried electrically conductive layer 54 positioned between the encapsulation layer 36 and the composite material base 32. The buried electrically conductive layer 54 may be patterned in a number of alternative embodiments to include one or more conductive traces, electrical connection pads, and electrical circuitry. In one embodiment of the present disclosure the buried layer 54 is copper.

Figure 6B:
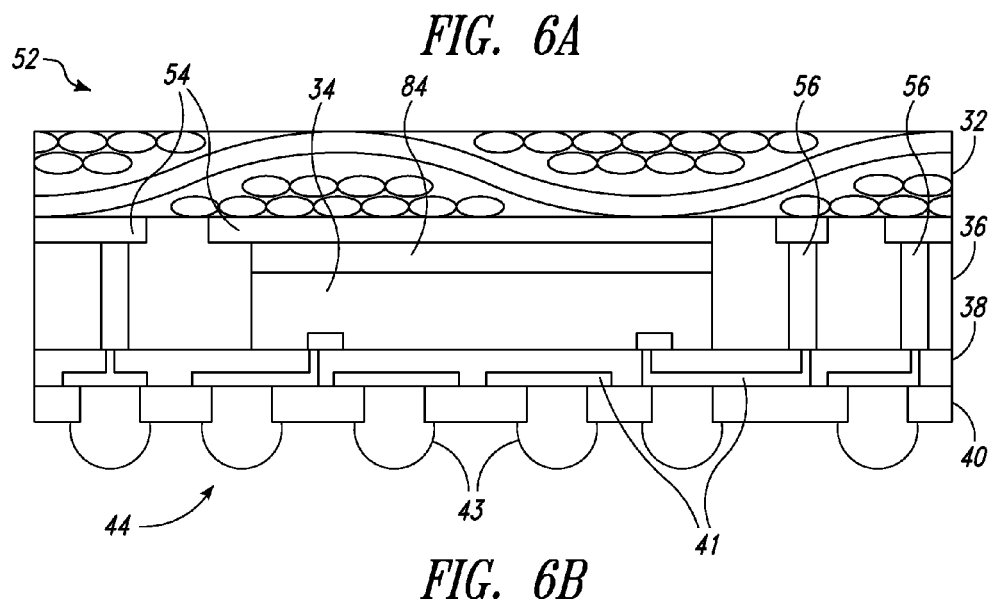

FIG. 6B is a cross-sectional view of the second package 52 in FIG. 6A, taken through 6B-6B. The second package 52 also includes a plurality of vias filled with electrically conductive material to form second interconnections 56 that extend through the encapsulation layer 36 and the redistribution layer 38. The second interconnections 56 electrically connect the buried electrically conductive layer 54 to the solder balls 43 via the first contacts 41.

The buried electrically conductive layer 54 provides in the second package 52 a second layer of electrical circuitry, in addition to the circuitry of the redistribution layer 38. The second layer of circuitry provides the opportunity to increase the circuit density of the package and therefore make the second package 52 smaller than other packages.

Figure 7A:
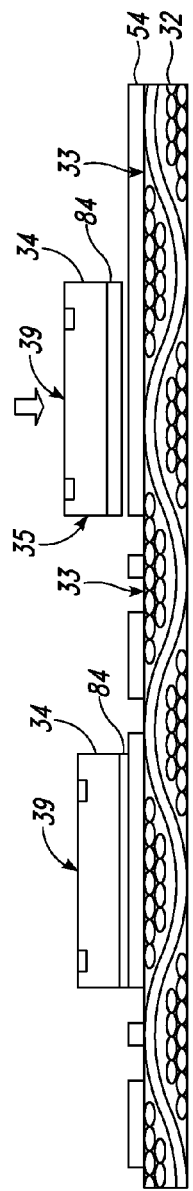
FIGS. 7A-7F are cross-sectional views of steps in a method of forming the package of FIGS. 6A and 6B having the composite material base.

FIGS. 7A-7F show a method of making the second package 52 having the composite material base 32 and the buried electrical conductive layer 54. In FIG. 7A, a conductive layer is formed on the first surface 33 of the base 32. The conductive layer is patterned to form the buried electrically conductive layer 54, which may include a plurality of pads, traces, or other circuit features. The semiconductor die 34 is attached to the two-sided adhesive 84, which is attached to a surface of the buried electrically conductive layer 54.

Figure 7B:
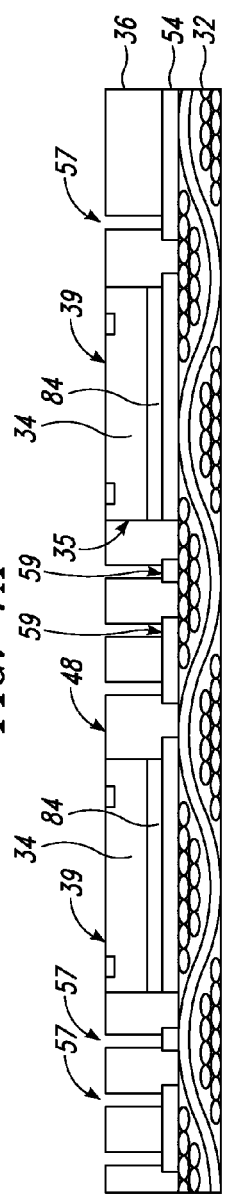

In FIG. 7B, the encapsulation layer 36 is formed on the buried electrically conductive layer 54 and adjacent the sidewalls 35 of the die 34. The encapsulation layer 36 surrounds the sidewalls 35 of the semiconductor die and, as in FIG. 5B, the first surface 48 of the encapsulation layer 36 is coplanar with the first surface 39 of the die 34. A plurality of through silicon vias (TSV) 57 are formed through the encapsulation layer 36, thereby re-exposing surface portions 59 of the buried conductive layer 54.

Figure 7C:
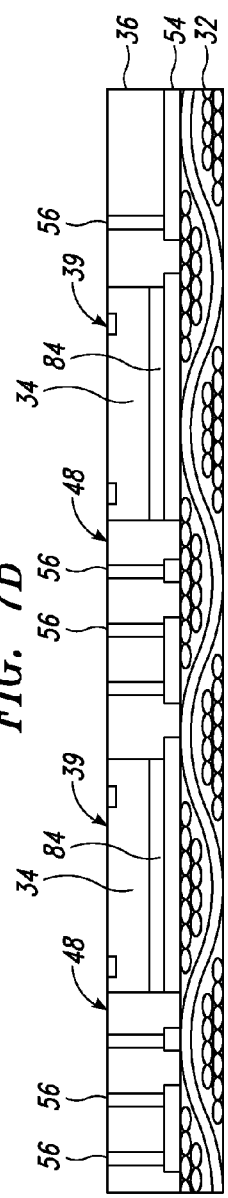
Figure 7D:
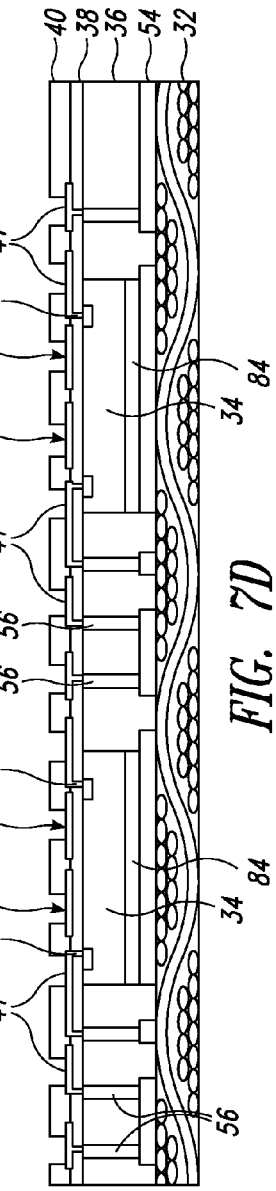

In FIG. 7C, a conductive material is formed in the plurality of TSVs 57 to form second interconnections 56. In FIG. 7D, the redistribution layer is formed on the first surface 48 of the encapsulation layer 36 and the first surface 39 of the die 34. The plurality of first interconnections 37 are formed through the redistribution layer to couple to the die 34 and to the second interconnections 56. The plurality of first contacts 41 are formed on the redistribution layer 38 and couple to the first interconnections 37. The second interconnections 56 connect the buried conductive layer 54 to the first contacts 41 and in some cases to the die 34. This arrangement allows coupling another die or electrical device to the second package 52. This will be described in more detail below.

Figure 7E:
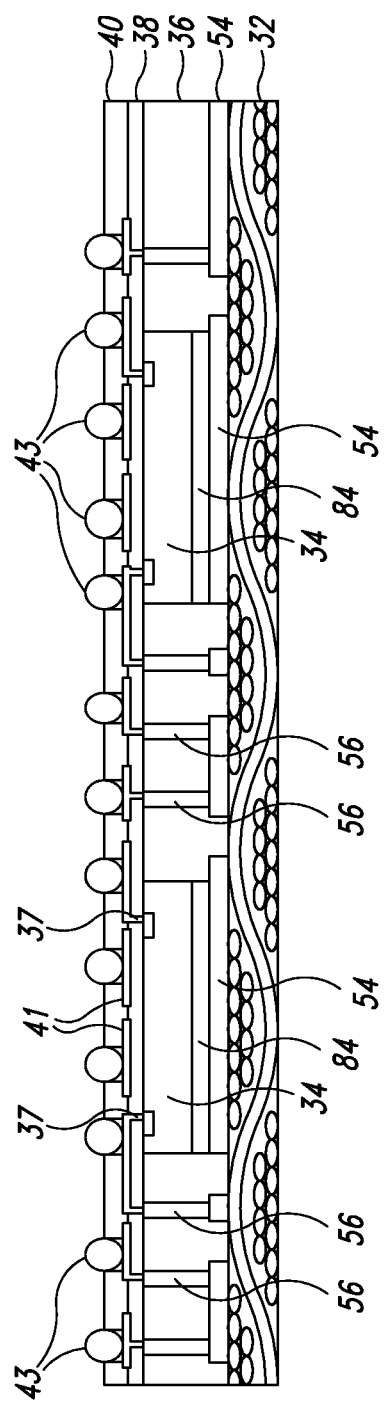
Figure 7F:
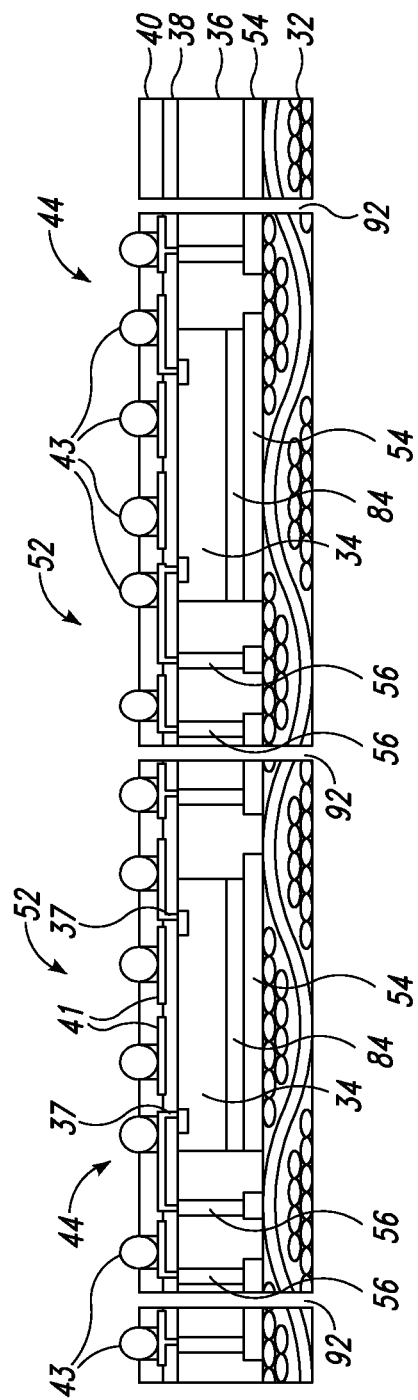

Subsequently, the passivation layer 40 is formed over the first contacts 41 and the redistribution layer 38. The plurality of openings 42 are formed to re-expose surface portions 45 of the first contacts 41. In FIG. 7E, the plurality of solder balls 43 of the ball grid arrays 44 are formed in the openings 42 in the passivation layer 40. The solder balls 43 electrically connect to the first contacts 41, which connects the solder balls 43 to the buried layer 54. In FIG. 7F, the overall structure formed on the base material 32 is singulated into the plurality of second packages 52 by forming cuts 92.

Figure 8A:
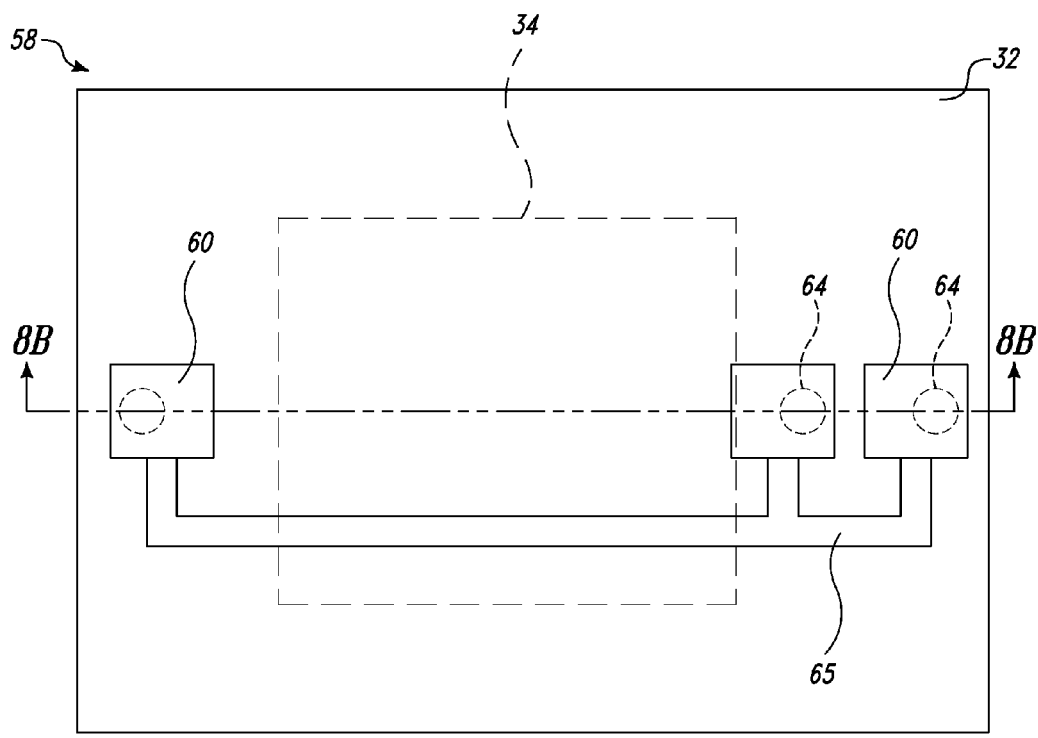
FIGS. 8A and 8B are top and cross-sectional views of a package having a composite material base formed in accordance with another embodiment of the present disclosure.
Figure 8B:
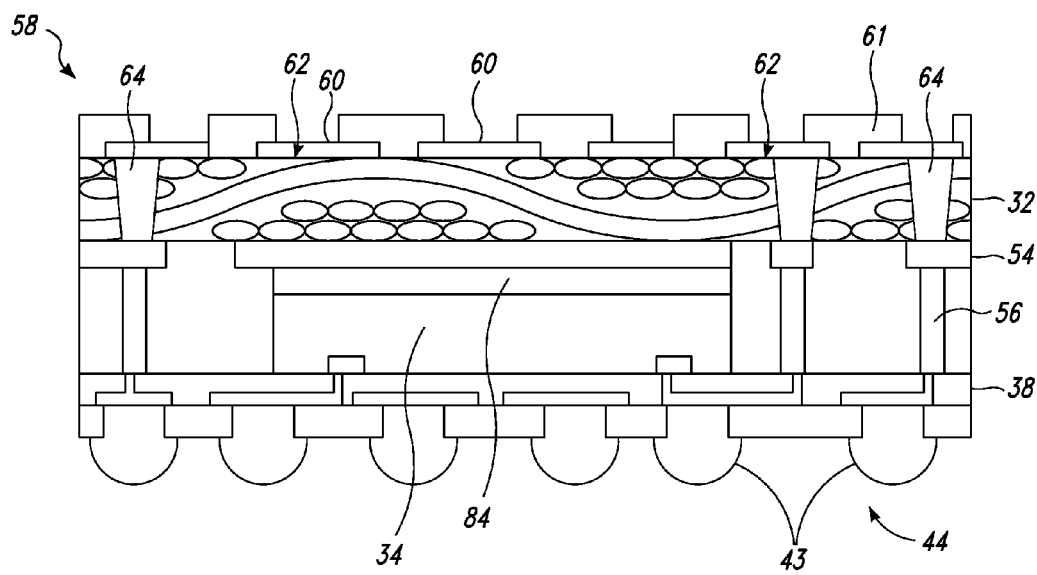

In FIGS. 8A and 8B, a third package 58 having the composite material base 32 is shown in accordance with yet another embodiment of the disclosure. FIG. 8A is a top down view of the composite material base 32 over the die 34 and over a plurality of second contacts 60 formed on a second surface 62 of the composite material base 32. At least some of the second contacts 60 may be electrically connected to each other by conductive traces 65.

FIG. 8B is a cross-sectional view of the third package 58 taken through 8B-8B. A second plurality of vias formed through the base 32 are filled with electrically conductive material to form third interconnections 64. The third interconnections 64 connect the second contacts 60 to the buried electrically conductive layer 54. The second contacts 60 provide yet another opportunity to increase the circuit density of the package 58.

FIGS. 9A-9C are cross-sectional views of steps in a method of forming the second contacts 60 on the third package 58. FIG. 9A is the composite material base 32 of FIG. 7E flipped over so that the second surface 62 is available for processing. The composite material base 32 is flipped prior to the singulation step in FIG. 7F.

In FIG. 9B, a plurality of vias 67 are formed through the composite material base 32 from the second surface 62 to re-expose a surface 69 of the buried conductive layer 54. The plurality of vias 67 may be formed by laser drilling or other via formation techniques.

In FIG. 9C, the plurality of vias 67 are filled with conductive material to form the third interconnections 64. The conductive material may be formed by plating techniques. After forming the conductive material in the vias 67, some excess conductive material may remain on the second surface 62 of the base 32. A planarization step may be used to make the conductive material of the third interconnections 64 coplanar with the second surface 62. The plurality of second contacts 60 are formed over the second surface 62 and over the third interconnections 64. The contacts 60 maybe coupled to traces 65, as shown in FIG. 8A. The traces 65 may be etched from the same layer of conductive material used to form the contacts 60. Some of the contacts 60 are electrically coupled to the die 34 through the second interconnections 56 and the first contacts 41.

A second passivation layer 61 is formed over the second contacts 60. A plurality of openings 63 are formed through the second passivation layer 61 to re-expose a surface 73 of the second contacts 60. The contacts 60 may be configured to receive wire bonds for connecting the third package 58 with other electronic components. The overall structure of FIG. 9C is singulated between the dies 34 to form the third packages 58. In an alternative embodiment, further processing is performed before singulation. This is described in more detail below with respect to FIGS. 10A-10B and 11A-11B.

Figure 10A:
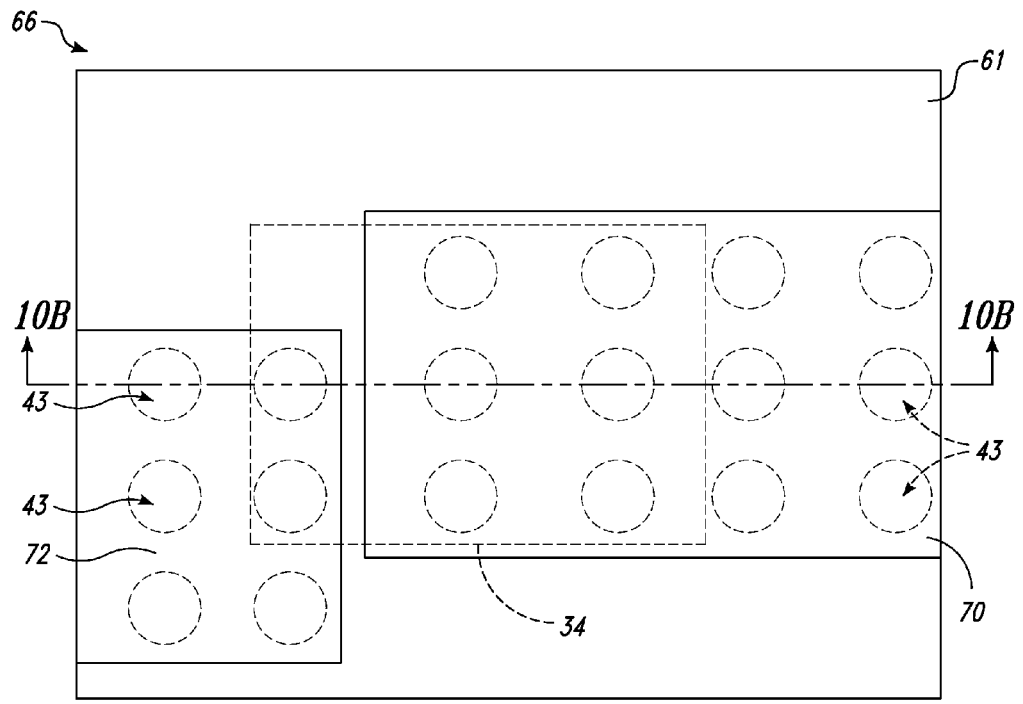
FIGS. 10A and 10B are top and cross-sectional views of a plurality of stacked packages having a composite material base in accordance with an embodiment of the present disclosure.
Figure 10B:
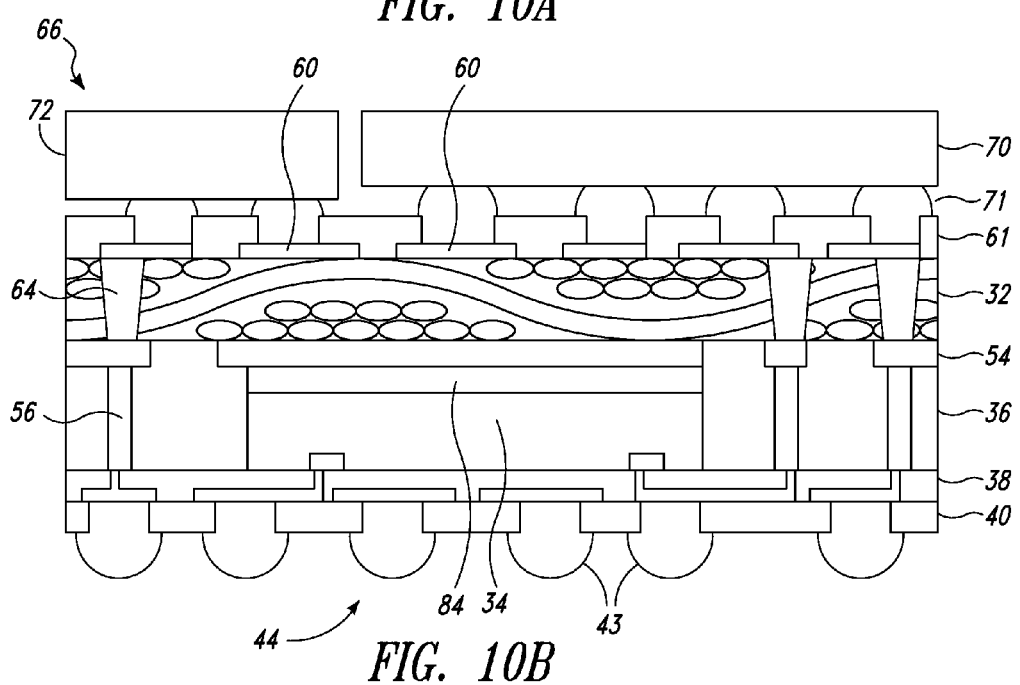

In FIGS. 10A and 10B, a fourth package 66 having the composite material base 32 is shown in accordance with still another embodiment of the disclosure. FIG. 10A is a top down view of the fourth package 66 having a fifth package 70 and a sixth package 72 coupled to the second contacts 60. The plurality of second contacts 60 are arranged to align with the solder balls 43 of the fifth and sixth packages 70, 72.

FIG. 10B is a cross-sectional view of the fourth package 66 of FIG. 10A taken through 10B-10B. The fifth and sixth packages 70, 72 are positioned over the second passivation layer 61. In one embodiment, a gap 71 of air remains between the second passivation layer 61 and the fifth and sixth packages 70, 72.

The solder balls 43 of the fifth and sixth packages 70, 72 couple to the third interconnections 64 which may couple to the die 34. This enables electrical communication between the semiconductor die 34 and the fifth and sixth packages 70, 72, which are all supported by the composite material base 32. The embodiment of the fourth package 66 enables multichip module (MOM) packaging at yet an even higher level of circuit densification and therefore compact package size.

FIGS. 11A and 11B are steps in the method of forming the fourth package 66 having its die 34 electrically connected to dies in the fifth and sixth packages 70, 72. The strength of the composite material base 32 is sufficient to support the plurality of packages, while allowing for sufficient flexibility in various operating environments.

FIG. 11A is the composite material base 32 of FIG. 9C having the second passivation layer 61 with openings 63 exposing the surface 73 of the second contacts 60. The fifth and sixth packages 70 and 72 each include a die and electrical connections (not shown) that couple to the plurality of solder balls 43. The fifth and sixth packages 70, 72 may be manually positioned or placed with a robotic arm. In FIG. 11B, the overall structure is singulated into the fourth, fifth, and sixth packages 66, 70, 72 by making a plurality of cuts 92.

In one embodiment, the buried electrical conductive layer 54 is an electromagnetic interference (EMI) shield buried within the packages. In another embodiment, the composite material base 32 has a coefficient of thermal expansion selected to match at least one of the encapsulation layer 36 and the die 34.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic package, comprising:
   a first semiconductor die having an active surface including a first plurality of contacts and an inactive surface;
   a flexible composite material base having a plurality of resilient fibers woven together in a support material, the inactive surface of the first semiconductor die being directly adhered to the composite material base;
   an encapsulation layer laterally surrounding the first semiconductor die, the encapsulation layer having opposite first and second surfaces, the second surface being on the composite material base;
   an insulating layer on the active surface of the die and on the first surface of the encapsulation layer; and
   a second plurality of contacts on the insulating layer electrically coupled to the first plurality of contacts of the first semiconductor die through the insulating layer.

2. The package of claim 1, further comprising:
   a third plurality of contacts on the second surface of the encapsulation layer.

3. The package of claim 2 wherein the composite material base has opposite first and second surfaces, the first surface being adjacent to the inactive surface of the first die and the second surface of the encapsulation layer, the second surface having a fourth plurality of contacts electrically coupled to the third plurality of contacts through the composite material base.

4. The package of claim 3, further comprising:
   a second semiconductor die having an active surface with a fifth plurality of contacts, the second die being adjacent to the second surface of the composite material base, the fifth plurality of contacts being electrically coupled to the fourth plurality of contacts on the composite material base.

5. The package of claim 1 wherein a thickness of the composite material is in the range of 20 microns and 400 microns.

6. A method, comprising:
   forming a package having a first die separated from a second die by a flexible composite material base, the first die having an active surface with a first plurality of contacts, the second die having an active surface with a second plurality of contacts, the composite base including a plurality of resilient fibers woven together in a support material, the forming of the package comprising:
      attaching an inactive surface of the first die to a first surface of the composite base;
      forming a third plurality of contacts on a second surface of the composite base;
      electrically coupling the second plurality of contacts of the second die to the third plurality of contacts of the composite base;
      forming an encapsulation layer adjacent to sidewalls of the first die and on the first surface of the composite base;

forming a redistribution layer on the active surface of the first die and on the encapsulation layer;
forming a fourth plurality of contacts on the redistribution layer;
electrically coupling the fourth plurality of contacts to the first plurality of contacts on the first die.

7. The method of claim 6, wherein the fibers of the composite base are fiberglass.

8. A method of making an electronic package, comprising:
forming a first plurality of contacts on a first surface of a flexible composite material base, the base including a plurality of flexible fibers woven together and a supporting material in spaces between the woven flexible fibers;
adhering an inactive surface of a semiconductor die to the first surface of the composite material base between ones of the first plurality of contacts;
forming an encapsulation layer on the first surface of the composite material base and on sidewalls of the semiconductor die;
forming a plurality of first vias through the encapsulation layer;
electrically coupling one of the first vias to a first surface of at least one of the first plurality of contacts;
forming an insulating layer on the encapsulation layer and on an active surface of the semiconductor die; and
forming a second plurality of contacts on the insulating layer;
electrically coupling the second plurality of contacts to the first plurality of contacts through the electrically conductive material in the first vias.

9. The method of claim 8, further comprising:
forming a plurality of second vias through the composite material base;
electrically coupling the plurality of second vias to a second surface of the first plurality of contacts;
forming a third plurality of contacts on a second surface of the composite material base; and
electrically coupling the third plurality of contacts to the first plurality of contacts through the plurality of second vias.

10. A method, comprising:
forming a plurality of packaged die each having a flexible composite base, the base including a plurality of flexible fibers woven together with a supporting material in spaces between the woven flexible fibers, the forming of the die comprising:
attaching an inactive surface of a plurality of first die to a first surface of the composite base, the plurality of first die having a first plurality of contacts on an active surface;
forming an encapsulation material on the first surface of the composite material and adjacent to sidewalls of the plurality of first die, the encapsulation material being coplanar with the active surface of the plurality of first die;
forming a dielectric layer on the active surface of the plurality of first die and on the encapsulation material;
forming a second plurality of contacts on the dielectric layer;
coupling ones of the first plurality of contacts to ones of the second plurality of contacts; and
separating the plurality of first die to form the plurality of packaged die by cutting through the dielectric layer, the encapsulation material, and the composite material.

11. The method of claim 10, further comprising:
forming a third plurality of contacts on the first surface of the composite material; and
coupling ones of the third plurality of contacts to ones of the second plurality of contacts on the dielectric layer.

12. The method of claim 11, further comprising:
forming a plurality of conductive vias through the composite material to expose a surface of the third plurality of contacts;
forming a fourth plurality of contacts on a second surface of the composite material; and
coupling ones of the fourth plurality of contacts to ones of the third plurality of contacts.

13. The method of claim 12, further comprising:
attaching a plurality of second die to the fourth plurality of contacts on the second surface of the composite material.

14. The method of claim 13 wherein the plurality of second die are attached prior to separating the plurality of first die.

15. The method of claim 13 wherein the plurality of second die are attached after separating the plurality of first die.

16. A stacked package, comprising:
a flexible composite base having a plurality of flexible fibers woven together and encased in a supporting resin, the base having a first surface and a second surface, the base including:
a first contact on the first surface;
a second contact on the second surface, the first contact coupled to the second contact;
a first die on the first surface of the base, the first die having a third contact on a first surface of the first die;
an encapsulation layer on the first surface of the composite base and adjacent to sidewalls of the first die;
a dielectric layer on the encapsulation layer and on the first surface of the first die;
a fourth contact on the dielectric layer coupled to the first through the encapsulation layer and to the third contact on the first die; and
a second die on the second surface of the composite base, the second die having a fifth contact coupled to the second contact.

17. The stacked package of claim 16 wherein the fourth contact is coupled to the third contact on the first die through the composite base and the encapsulation layer.

18. The stacked package of claim 16 wherein the composite base includes fiberglass encased in the supporting resin.

* * * * *